US008951603B2

(12) United States Patent
Watanabe et al.

(10) Patent No.: US 8,951,603 B2
(45) Date of Patent: Feb. 10, 2015

(54) METHOD FOR PRODUCING FERROELECTRIC THIN FILM

(75) Inventors: Toshiaki Watanabe, Sanda (JP); Hideaki Sakurai, Naka-gun (JP); Nobuyuki Soyama, Naka-gun (JP); Toshihiro Doi, Naka-gun (JP)

(73) Assignee: Mitsubishi Materials Corporation, Tokyo (JP)

( * ) Notice: Subject to any disclaimer, the term of this patent is extended or adjusted under 35 U.S.C. 154(b) by 228 days.

(21) Appl. No.: 13/471,845

(22) Filed: May 15, 2012

(65) Prior Publication Data
US 2012/0295100 A1  Nov. 22, 2012

(30) Foreign Application Priority Data

May 17, 2011 (JP) .................................. 2011-110682
Mar. 28, 2012 (JP) .................................. 2012-073404

(51) Int. Cl.
*B05D 5/12* (2006.01)
*B32B 9/04* (2006.01)
(Continued)

(52) U.S. Cl.
CPC .......... *H01L 28/55* (2013.01); *H01L 21/02197* (2013.01); *H01L 21/02282* (2013.01);
(Continued)

(58) Field of Classification Search
None
See application file for complete search history.

(56) References Cited

U.S. PATENT DOCUMENTS 5,985,404 A * 11/1999 Yano et al. ................. 428/846.1
6,086,665 A *  7/2000 Kamisawa et al. ...... 106/287.18
(Continued)

FOREIGN PATENT DOCUMENTS

EP       0993953 A2    4/2000
JP       06-116095 A   4/1994
(Continued)

OTHER PUBLICATIONS

Park et al., "Effects of Thickness on Piezoelectric Properties of Highly Oriented Lead Zirconate Titanate Films", Journal of the American Ceramic Society, vol. 89 No. 7, (2006), pp. 2314-2316.*
(Continued)

*Primary Examiner* — Michael Cleveland
*Assistant Examiner* — Lisha Jiang
(74) *Attorney, Agent, or Firm* — Edwards Wildman Palmer LLP; James E. Armstrong, IV; Nicholas J DiCeglie, Jr.

(57) ABSTRACT

A method for producing a ferroelectric thin film comprising: coating a composition for forming a ferroelectric thin film on a base electrode of a substrate having a substrate body and the base electrode that has crystal daces oriented in the (111) direction, calcining the coated composition, and subsequently performing firing the coated composition to crystallize the coated composition, and thereby forming a ferroelectric thin film on the base electrode, wherein the method includes formation of an orientation controlling layer by coating the composition on the base electrode, calcining the coated composition, and firing the coated composition, where an amount of the composition coated on the base electrode is controlled such that a thickness of the orientation controlling layer after crystallization is in a range of 5 nm to 30 nm, and thereby controlling the preferential crystal orientation of the orientation controlling layer to be in the (110) plane.

10 Claims, 4 Drawing Sheets

(51) Int. Cl.
*H01L 49/02* (2006.01)
*H01L 21/02* (2006.01)
*H01L 41/08* (2006.01)
*H01L 41/318* (2013.01)
*H01L 41/319* (2013.01)
*H01L 21/28* (2006.01)
*H01L 41/187* (2006.01)

(52) U.S. Cl.
CPC ...... *H01L21/02304* (2013.01); *H01L 41/0815* (2013.01); *H01L 41/318* (2013.01); *H01L 41/319* (2013.01); *H01L 21/28291* (2013.01); *H01L 28/65* (2013.01); *H01L 28/75* (2013.01); *H01L 41/1876* (2013.01)
USPC ............ 427/126.1; 427/372.2; 427/379; 427/380; 427/402; 427/419.1; 427/79; 427/100; 428/221; 428/323; 428/332

(56) References Cited

U.S. PATENT DOCUMENTS 6,376,090 B1    4/2002  Kijima
2007/0271750 A1* 11/2007  Hamada et al. ............... 29/25.01
2009/0096328 A1*  4/2009  Shibata et al. ................ 310/346

FOREIGN PATENT DOCUMENTS

| JP | 2000164818 A |   | 6/2000 |           |
|----|--------------|---|--------|-----------|
| JP | 2004292218 A | * | 10/2004 | ............ C30B 29/32 |
| JP | 2008306009 A |   | 12/2008 |           |
| JP | 2011-029399 A |   | 2/2011 |           |

OTHER PUBLICATIONS

Extended European Search Report issued in European Patent Application No. EP 12168091.2 dated Jun. 6, 2014.
S. Yokayama et al., "Dependence of electrical properties of epitaxial Pb(Zr, Ti)O$_3$ thick films on crystal orientation and Zr/(Zr+T1) ratio", Journal of Applied Physics 98, 094106 (2005).

* cited by examiner

METHOD FOR PRODUCING FERROELECTRIC THIN FILM

CROSS REFERENCE TO RELATED APPLICATIONS

This application is related to co-pending application: "METHOD FOR PRODUCING FERROELECTRIC THIN FILM" filed even date herewith in the names of Toshiaki WATANABE, Hideaki SAKURAI, Nobuyuki SOYAMA and Toshihiro DOI, which claims priority to Japanese App. Nos. 2011-110680 and 2012-073402, filed May 17, 2011 and Mar. 28, 2012, respectively; each of the above-identified applications is assigned to the assignee of the present application and is incorporated by reference herein.

BACKGROUND OF THE INVENTION

1. Field of the Invention

The present invention relates to a method for producing a ferroelectric thin film that is controlled to have preferential crystal orientation in the (110) plane with a simple process.

Priority is claimed on Japanese Patent Application No. 2011-110682 filed on May 17, 2011 and Japanese Patent Application No. 2012-073404 filed on Mar. 28, 2012, the content of which is incorporated herein by reference.

2. Description of Related Art

In recent years, ferroelectric thin films utilizes as capacitors and piezoelectric elements are widely developed so as to suffice requirements for downsizing electronic elements.

Lead zirconate titanate (PZT) is a ferroelectric material that has a perovskite structure and exhibits excellent ferroelectric properties. Using a chemical solution deposition (CSD) method utilizing sol-gel solution, it is possible to achieve homogeneous film composition in the plane of a substrate with inexpensive film-forming process. Therefore, the CSD method is known as a method of obtaining film-capacitors utilizing the PZT as a material for ferroelectric thin films.

Where the ferroelectric film is formed by the CSD method utilizing sol-gel solution, platinum or iridium having preferred crystal faces oriented in the (111) direction may be formed as a base electrode on a substrate. By forming the ferroelectric thin film on the base electrode formed on the substrate, it has been possible to obtain ferroelectric thin films having preferred crystal orientation in the (111) plane depending on the (111) orientation of the base substrate.

Such ferroelectric thin films having a (111)-preferred orientation are appropriately utilized in IPD (Integrated Passive Device), non-volatile memory or the like because of their high withstand voltage and life-time reliability.

On the other hand, conventional methods known to form a film having preferred crystal orientation in (100) plane or (110) plane on the base electrode oriented in the (111) direction include using a seed layer composed of a material different from the ferroelectric thin film and introducing a buffer layer composed of a material different from the ferroelectric thin film so as to suppress the structural influence of the bottom electrode. Ferroelectric thin films having a preferred orientation in (100) plane are appropriately used in the application such as actuators because of large $e_{31}$ piezoelectric constant. Ferroelectric thin films having a preferred orientation in (110) plane are appropriately used in the application such as capacitors because of the large dielectric constant.

A method for producing a ferroelectric film including introduction of a buffer layer is disclosed, for example, in Japanese Unexamined Patent Application First Publication No. 2011-29399 (Claim 7, paragraphs [0003], [0022] to [0026], [0039] and FIG. 1). This method for producing a ferroelectric film includes: a step of forming a base film oriented to a predetermined crystal plane on a surface of a substrate; a step of forming a carbon film on the base film; a step of forming an amorphous thin film containing ferroelectric material on the carbon film; and a step of forming a ferroelectric film on the base film by heating and thereby crystallizing the amorphous thin film. The ferroelectric film formed by this method is oriented to a crystal plane different from the predetermined crystal plane, and the ferroelectric material is composed of at least one of five types of materials, a first type material composed of perovskite structure and bismuth layered-structure oxide, a second type material composed of superconducting oxide, a third type material composed of tungsten-bronze structure oxide, a fourth type material composed of at least one selected from a group consisting of CaO, BaO, PbO, ZnO, MgO, $B_2O_3$, $Al_2O_3$, $Y_2O_3$, $La_2O_3$, $Cr_2O_3$, $Bi_2O_3$, $Ga_2O_3$, $ZrO_2$, $TiO_2$, $HfO_2$, $NbO_2$, $MoO_3$, $WO_3$, and $V_2O_3$, a fifth type material containing the fourth type material and $SiO_2$, and a sixth type material containing the fourth type material, $SiO_2$, and $GeO_2$. In Japanese Unexamined Patent Application First Publication No. 2011-29399 (hereafter referred to as Patent Reference 1), the crystal orientation of the ferroelectric film formed on the carbon film is controlled by controlling a thickness of the carbon film formed as a buffer layer. In the practical embodiment described in Patent Reference 1, orientation of the PZT is controlled to have a (111) plane+(001) plane orientation where a thickness x of the diamond like carbon (DLC) film formed as the carbon film is in the range of 0 nm<x<10 nm, the PZT is controlled to have a (001) plane orientation where the thickness x of the DLC film is 10 nm, he PZT is controlled to have a (001) plane+(110) plane orientation where the thickness x of the diamond like DLC film is in the range of 10 nm<x<100 nm, he PZT is controlled to have (110) plane orientation where the thickness x of the DLC film is 100 nm, and orientation of the PZT is controlled to have weak (110) orientation where the thickness x of the DLC film is larger than 100 nm.

The Patent Reference 1 also describes constituting a buffer layer by stacking $LaNiO_3$ strongly self-oriented to (001) direction on the base electrode having (111) orientation, and forming a PZT film on the LaNiO3 buffer layer, and thereby achieving a PZT film having (001) orientation.

However, the method described in the above-described Patent Reference 1 requires complicated processes including introduction of the seed layer and the buffer layer. In addition, the presence of such a seed layer and a buffer layer may cause deterioration of properties of the ferroelectric thin film and may cause contamination or the like.

As a method for controlling crystal orientation of ferroelectric thin film, for example, Japanese Unexamined Patent Application, First Publication No. H06-116095 (hereafter referred to as Patent Reference 2) discloses a method including: coating precursor solution of PZT or PLZT on a platinum substrate having crystal faces oriented in (111) direction, and heating the substrate to form a ferroelectric thin film, wherein the substrate being coated with the precursor solution is firstly subjected to a heat treatment at a temperature of 150 to 550° C. to achieve a designated crystal orientation, and is subsequently subjected to firing at a temperature of 550 to 800° C. to crystallize the precursor, thereby selectively orienting the crystal plane of the thin film to a specific direction depending on the heat treatment temperature (Claims 1 to 4, paragraphs [0005], [0006], FIG. 1).

In Patent Reference 2, crystal orientation of ferroelectric thin film is controlled depending on the temperature range of heat treatment corresponding to preliminary firing, thereby forming a ferroelectric film having controlled crystal orientation on the base electrode directly without interposing a seed layer or a buffer layer. Specifically, Patent Reference 2 describes that the crystal orientation is controlled such that preferred orientation in the (111) plane is achieved by the heat treatment at 150 to 250° C., preferred orientation in the (111) plane and (100) plane is achieved by a heat treatment at 250 to 350° C., and preferred orientation of (100) plane and (200) plane is achieved by a heat treatment at 450 to 550° C.

However, according to the above-described method of Patent Reference 2, it is not possible to form a ferroelectric thin film including preferentially oriented (100) crystal plane on the base electrode.

When the Pb-containing perovskite type ferroelectric film has thin thickness, there is a case that crystal nuclei cannot be generated in sufficient density, resulting in anomalous growth of large crystals, and making it difficult to control the grain diameters of crystals. The ferroelectric film with such anomalously grown crystals is sometimes inferior in insulation property, thereby including problems in its quality.

An object of the present invention is to provide a method for producing ferroelectric thin film that enables achievement of a ferroelectric thin film that is controlled to have preferred crystal orientation of (110) plane with a simple process without forming a seed layer or a buffer layer.

The other object of the present invention is to provide a method for producing a ferroelectric thin film by which the thickness of a ferroelectric film having preferred crystal orientation in the (110) plane can be arbitrary adjusted depending on its intended use.

Still another object of the present invention is to provide a method for producing ferroelectric thin film that enables control of crystal diameters of a ferroelectric thin film having preferred crystal orientation of (110) plane.

SUMMARY OF THE INVENTION

Based on the extensive research by the inventors for ferroelectric thin film having controlled crystal orientation, it was found that a ferroelectric thin film controlled to have preferred crystal orientation in the (110) plane being independent of the (111) direction of the base electrode could be achieved simply without forming a seed layer or a buffer layer by controlling a thickness of a ferroelectric thin film when the ferroelectric thin film was formed by the following sol-gel method including: coating a composition for forming a ferroelectric thin film on a base electrode of a substrate having the base electrode having crystal faces oriented in the (111) direction; drying and preliminarily firing the coated composition to form a gel film; and firing and crystallizing the gel film. It is also found that where the thus achieved ferroelectric thin film controlled to have preferred orientation in the (110) plane is used as a base layer, and a ferroelectric thin film is further formed on the base layer, a ferroelectric thin film having crystal orientation similar to the base layer could be obtained irrespective of the thickness of the ferroelectric film. It is also found that ferroelectric thin film controlled to have preferred crystal orientation in the (110) plane can be achieved with fine-grained crystal texture by introducing a crystal grain size controlling layer to increase nucleation density before forming the ferroelectric film having a crystal orientation in the (110) plane. The present invention has been developed based on the above-described findings.

A first aspect of the present invention is a method for producing a ferroelectric thin film including: coating a composition for forming a ferroelectric thin film on a base electrode of a substrate having a substrate body and the base electrode that has crystal faces oriented in the (111) direction, performing calcination of the coated composition, and subsequently performing filing of the coated composition to crystallize the coated composition, and thereby forming a ferroelectric thin film on the base electrode, wherein the method includes performing formation of an orientation controlling layer by a process including coating the composition for forming a ferroelectric thin film on the base electrode, performing calcination of the coated composition, and performing firing of the coated composition, where an amount of the composition for forming a ferroelectric thin film coated on the base electrode is controlled such that a thickness of the orientation controlling layer after crystallization is in a range of 5 nm to 30 nm, and thereby controlling preferred crystal orientation of the orientation controlling layer to be in the (110) plane.

In the above-described first aspect, since the crystal faces are oriented in the (111) direction, the surface of the base electrode is substantially normal (perpendicular) to the (111) axis of the crystals. The orientation controlling layer formed on the base electrode is controlled to have (110)-preferred orientation.

In the above-described first aspect, the orientation controlling layer may be formed by repeated coating and calcination of the composition for forming a ferroelectric thin film for a plurality of times, and subsequently firing the coated composition.

In the above-described first aspect, the substrate body may be a silicon substrate or a sapphire substrate. The base electrode may be made of at least one metal selected from Pt, Ir, and Ru.

A second aspect of the present invention is a method for producing ferroelectric thin film according to the first aspect, wherein the calcination for forming the orientation controlling layer is performed at a temperature in a range of 180° C. to 300° C.

A third aspect of the present invention is a method for producing a ferroelectric thin film according to the first aspect or the second aspect, further including forming a crystal diameter controlling layer on the base electrode before forming the orientation controlling layer, wherein the orientation controlling layer is formed on the crystal diameter controlling layer. In the above-described third aspect, the crustal diameter controlling layer may be made of a compound selected from at least one of lead titanate, lead titanate zirconate, and lead zirconate.

A fourth aspect of the present invention is a method for producing a ferroelectric thin film according to any one of the above-described first aspect to third aspect, further including, after forming the orientation controlling layer, forming a thickness adjusting layer having crystal orientation that is the same as the crystal orientation of the orientation controlling layer by coating the composition for forming a ferroelectric thin film on the orientation controlling layer, performing calcination of the coated composition, and performing firing of the coated composition.

In the above-described fourth aspect, each of coating of the coating of the composition, calcination, and firing may be performed for a plurality of times. For example, the firing may be performed after repeating coating of the composition and calcination of the coated composition for a plurality of times. The process including firing after a repeated coating and calcination may be repeated a plurality of times. The composition used in the formation of the thickness adjusting layer may be the same composition used in the formation of the orientation controlling layer. Alternatively, concentration of a component to be crystallized may be different between a composition (a first composition) used in the formation of the orientation controlling layer and a composition (a second composition) used in the formation of the thickness adjusting layer.

A fifth aspect of the present invention is a method for producing a ferroelectric thin film according to the fourth aspect, wherein the calcination for forming the thickness adjusting layer is performed at a temperature in a range of 300° C. to 450° C.

A sixth aspect of the present invention is a method for producing a ferroelectric thin film according to any one of the first to fifth aspect, wherein the ferroelectric thin film includes Pb-containing perovskite type oxide, and the composition for forming the ferroelectric thin film includes β-diketone and polyhydric alcohol.

A seventh aspect of the present invention is a method for producing a ferroelectric thin film according to the sixth aspect, wherein the β-diketone is acetylacetone and the polyhydric alcohol is propylene glycol.

An eighth aspect of the present invention is a ferroelectric thin film that is produced by a method according to any one of the first to seventh aspects and has preferred crystal orientation in the (110) plane.

A ninth aspect of the present invention is a composite electronic part of a device selected from a thin-film capacitor, a capacitor, an IPD, a condenser for a DRAM memory, a stacked capacitor, a gate insulator of a transistor, a non-volatile memory, a pyloelectric infrared sensor, a piezoelectric element, an electro-optic element, an actuator, a resonator, an ultrasonic motor, and a LC noise filer, wherein the composite electronic part includes a ferroelectric thin film according to the eighth aspect.

According to the first aspect of the present invention, the method for producing a ferroelectric thin film includes coating a composition for forming a ferroelectric thin film on a base electrode of a substrate having the base electrode in which crystal plane is oriented to (111) direction, heating the coated composition to crystallize the coated composition, wherein the ferroelectric thin film includes an orientation controlling layer having crystal orientation controlled to preferred orientation of (110) plane by controlling a thickness of the orientation controlling layer after crystallization to be in a range of 5 nm to 30 nm. By thus controlling the thickness of the orientation controlling layer after the crystallization in the above-described relatively thin thickness range, it is possible to achieve a ferroelectric thin film having crystals controlled to have a preferred orientation in the (100) plane simply without forming a seed layer or a buffer layer.

According to the second aspect of the present invention, calcination temperature for forming the orientation controlling layer is controlled to be in a range of 180° C. to 300° C. By this constitution, it is possible to form the ferroelectric thin film controlled to have preferred orientation in the (110) plane more stably.

According to the third aspect of the present invention, crystal diameter controlling layer is formed on the base layer before forming the orientation controlling layer, thereby suppressing anomalous grain growth in the orientation controlling layer. As a result, it is possible to achieve an orientation controlling layer having preferred orientation in the (110) plane with fine-grained crystal texture.

According to the fourth aspect of the present invention, after forming the orientation controlling layer, a thickness adjusting layer is formed on the orientation controlling layer by coating a composition for forming a ferroelectric film on the orientation controlling layer, calcining (calcinating) and firing the coated composition, thereby forming a thickness adjusting layer having the same crystal orientation as the crystal orientation of the orientation controlling layer. Therefore, it is possible to achieve a thickness adjusting layer which is controlled to have preferred crystal orientation in the (110) plane. By this constitution, it is possible to control a thickness of the ferroelectric thin film having preferred orientation in the (110) plane arbitrarily depending on the use of the ferroelectric thin film.

According to the fifth aspect of the present invention, when the thickness adjusting layer is formed, temperature of the calcination after coating a composition for forming a ferroelectric thin film is controlled within a range of 300° C. to 450° C. By this constitution, it is possible to form a ferroelectric thin film controlled to have preferred orientation in the (100) plane more stably depending on the crystal orientation of the thickness adjusting layer further stably.

DETAILED DESCRIPTION OF THE INVENTION

Figure 1:
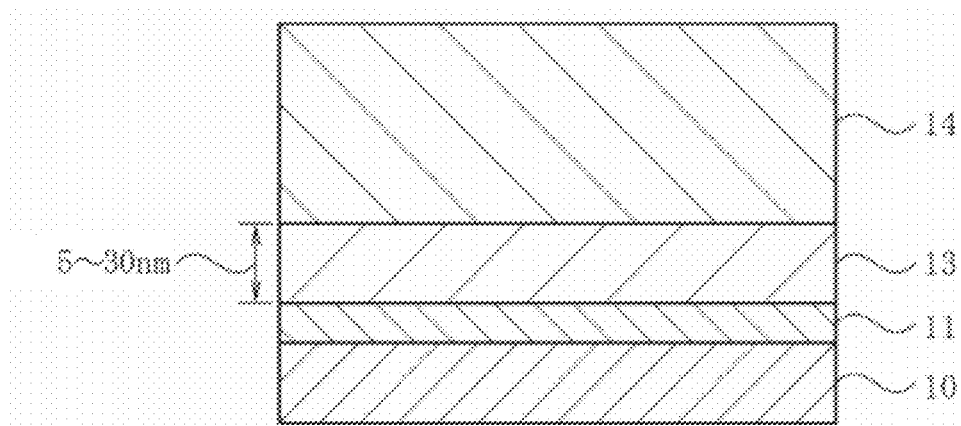
FIG. 1 is a schematic cross sectional drawing for explaining production method according to a first aspect of the present invention.

Embodiments of the present invention are explained with reference to drawings.

The present invention improves a method for producing ferroelectric material including: coating a composition for forming a ferroelectric thin film on a base electrode of a substrate that has the base electrode having crystal faces oriented in the (111) direction, heating the coated composition, and thereby crystallizing the coated composition.

In the present invention, the ferroelectric thin film includes an orientation controlling layer (first ferroelectric layer). Formation process of the orientation controlling layer includes: performing formation of a coated film by coating a composition for forming a ferroelectric thin film on the base electrode directly or interposing a crystal diameter controlling layer therebetween; performing calcination (drying and preliminary firing) of the coated film to form a gel film; and performing firing (main firing) of the gel film to crystallize the gel film. The amount of the composition for forming a ferroelectric thin film is controlled such that a thickness of the orientation controlling layer after crystallization is controlled to be in the range of 5 nm to 30 nm.

By this constitution, it is possible to control the crystals of the orientation controlling layer formed as a polycrystalline film to have a preferred orientation in the (110) plane. The state that "crystals of a layer have a preferred orientation in the (110) plane" denotes a state that (110) planes of the crystals are preferentially oriented substantially parallel to the surface (interface) of the layer. In other words, the state may be described that the layer has (110)-preferred orientation.

For example, where crystal orientation of the orientation controlling layer is analyzed by X-ray diffraction, diffraction intensity of (110) plane shows maximum value in diffraction intensities of crystal planes of constituent crystals of the orientation controlling layer. The ferroelectric thin film may be constituted of the above-described orientation controlling layer. On the other hand, the ferroelectric thin film may further include a thickness adjusting layer formed on the orientation controlling layer. Formation process of the thickness adjusting layer includes: performing coating of a composition for forming a ferroelectric thin film on the orientation controlling layer to form a coated film; performing calcination of the coated film to form a gel film; and performing firing of the gel film to crystallize the gel film. Since the orientation controlling layer is formed as a base layer, the thickness adjusting layer (second ferroelectric layer) formed on the orientation controlling layer is formed as a polycrystalline film that is controlled to have preferred crystal orientation in the (110) plane.

Where the crystal diameter controlling layer is formed, a gel film (having a thickness of about 1 to 10 nm) is formed as the crystal diameter controlling layer on the base electrode, and the orientation controlling layer is formed on the crystal diameter controlling layer. Formation process of the crystal diameter controlling layer includes: coating a composition for the crystal diameter controlling layer on the base electrode to form a coated film; and calcining the coated film to form a gel film.

Preferably, the ferroelectric thin film constituted of the orientation controlling layer or of the orientation controlling layer and the thickness adjusting layer may be made of at least one Pb-containing perovskite type oxide selected from PZT, PLZT, PMnZT, and PNbZT. The crystal diameter controlling layer may be made of at least one compound selected from lead titanate, lead titanate zirconate, and lead zirconate. Each of the composition for forming a ferroelectric thin film and the composition for forming a crystal diameter controlling layer may be a composition that includes organic solvent and organic metal compound dissolved in the organic solvent.

The calcination and firing in the above-explained formation process of the orientation controlling layer and the thickness adjusting layer, and calcination in the above-explained formation process of the crystal diameter controlling layer may be performed by heat treatment of a substrate after forming the coated film at a predetermined temperature in a predetermined atmosphere.

Hereafter, embodiments of the present invention is explained with reference to the drawings.

FIG. 1 shows a schematic cross sectional view of a constitution formed by the method according to a first embodiment of the invention. As shown in FIG. 1, in a first embodiment, a base electrode 11 having crystal faces oriented in the (111) direction is formed on a substrate body 10, and a ferroelectric thin film is formed on the base electrode 11. In the present invention, the ferroelectric thin film includes an orientation controlling layer (first ferroelectric layer) 13 that is controlled to have preferred crystal orientation in the (110) plane, and thickness of the orientation controlling layer 13 after the crystallization is controlled to be in the range of 5 nm to 30 nm. By the thus controlling the thickness of the orientation controlling layer 13 after the crystallization to be in the range of 5 nm to 30 nm, it is possible to achieve a ferroelectric thin film that is controlled to have preferred crystal orientation in the (110) plane simply without forming a seed layer or a buffer layer. It is considered that, where a thickness of the orientation controlling layer after the crystallization is controlled to be in the above-described range of 5 nm to 30 nm, crystals of the orientation controlling layer is spontaneously oriented so as to minimize the surface energy, resulting in preferred crystal orientation in the (110) plane. A thickness of the orientation controlling layer 13 after the crystallization is in the range of 5 nm to 30 nm. Where the thickness is less than 5 nm, it is not preferable since the coated composition does not form a film but shows islands like distribution on the sub-layer. A thickness exceeding 30 nm is not preferable, since the layer thicker than 30 nm does not have preferred orientation in the (110) plane but shows different orientations. More preferably, thickness of the orientation controlling layer after the crystallization is in the range of 20 nm to 30 nm. Where the thickness is less than 20 nm, the layer occasionally has crystal orientation other than (110) plane depending on the thermal conditions. Where the thickness exceeds 30 nm, the layer has crystal orientation other than (110) plane.

A refractory (heat-resisting) substrate such as silicon substrate, sapphire substrate or the like is used as the substrate body 10 for producing a ferroelectric thin film. A base electrode 11 having crystal faces oriented in the (111) direction is formed on the substrate 10. The base electrode is made of a material that has electro-conductivity and that is not reacted with the ferroelectric thin film. For example, the base electrode may be made of at least one metal selected from Pt, Ir, and Ru. In the above and in the following description the base electrode having crystal faces oriented in the (111) direction denotes a state that faces of the crystals exposed on the surface of the base electrode is substantially normal to the (111) axis. The above-explained base electrode may be formed on the substrate body by sputtering method or the like. Preferably, the ferroelectric thin film is made of Pb-containing perovskite type oxide (Pb-containing oxide having perovskite structure). For example, the ferroelectric thin film may be made of at least one composite oxide selected from PZT (lead zirconate titanate), PLZT (lead lanthanum zirconate ritanate), PMnZT (manganese-doped lead zirconate titanate), and PNbZT (niobium-doped lead zirconate titanate).

A composition for forming a ferroelectric thin film is made of a solution in which organic metal compound is dissolved in organic solvent such that materials for constituting the composite oxide provides designated atomic ratio.

As a raw material for the composite oxide, it is preferable to use chemical compound in which organic group is connected to respective metallic element such as Pb, La, Zr, and Ti via a oxygen or nitrogen atom of the organic group. For example, the raw material may be selected from one or two or more compounds selected from metal alkoxide, metal diol complex, metal triol complex, metal carbonate, metal β-diketonate complex, metal β-diketoester complex, metal β-iminoketo complex, and metal amino complex. Especially, metal alkoxide, hydrolysate of the metal alkoxide, or organic salt are preferred. For example, lead acetate (Pb(OAc)$_2$ or lead diisopropoxide (Pb(OiPr)$_2$) may be used as a lead compound. Lanthanum acetate (La(OAc)$_3$) or lanthanum triisopropoxide: La(OiPr)$_3$ may be used as a lanthanum compound. Titanium alkoxide such as titanium tetraethoxide: Ti(OEt)$_4$, titanium tetraisopropoxide: Ti(OiPr)$_4$, titanium tetra-n-butoxide: Ti(OnBu)$_4$, titanium tetra-iso-butoxite: Ti(OiBu)$_4$, titanium tetra-t-butoxide: Ti(OtBu)$_4$, and titanium dimetoxy-di-isopropoxide: Ti(OMe)$_2$(OiPr)$_2$ may be used as a titanium compound. Like as the above-described titanium compound, zirconium compound may be selected from zirconium olkoxides such as zirconium methoxide: Zr(OEt)$_4$, zirconium tetraisopropoxide: Zr(OiPr)$_4$, zirconium tetra-n-butoxide:

Zr(OnBu)$_4$, zirconium tetra-iso-butoxite: Zr(OiBu)$_4$, zirconium tetra-t-butoxide: Zr(OtBu)$_4$, and zirconium dimetoxy-di-isopropoxide: Zr(OMe)$_2$(OiPr)$_2$. The above-described metal alkoxide may be used as it is. Alternatively, hydrolysate of the metal alkoxide may be used so as to enhance decomposition.

In the preparation process of the composition for forming a ferroelectric material, the above-explained raw materials are dissolved at a ratio corresponding to the chemical composition of designated ferroelectric thin film in an appropriate solvent thereby controlling the concentration to a value that is appropriate for coating.

As a typical example, precursor solution as the composition for forming a ferroelectric thin film can be obtained by below-described flow of solution synthesis. Zr source (for example, zirconium tetra-n-butoxide) and Ti source (for example, titanium isopropoxide), and stabilizing agent (for example, acetylacetone) are contained in a reaction vessel and are refluxed in nitrogen atmosphere. Next, chemical compound after the refluxing is added with Pb source (for example, lead acetate trihydrate) and solvent (for example, propylene glycol), and is refluxed in nitrogen atmosphere to obtain a solution. After removing byproducts from the solution by vacuum distillation, concentration of the solution is modified by adding propylene glycol. Further, n-butanol is added to the solution. As a result, a composition for forming a ferroelectric thin film is obtained.

The solvent used in the preparation of the composition for forming ferroelectric thin film may be selected depending on the source materials for the ferroelectric thin film. In general case, calboxylic acid, alcohol (for example, propylene glycol as a polyhydric alcohol), ester, ketones (for example, acetone, methyl ethyl ketone), ethers (for example, dimethyl ether, diethyl ether), cycloalkanes (for example, cyclohexane, cyclohexanol), aromatic solvents (for example, benzene, toluene, xylene), tetrahydrofuran or the like may be used as the solvent. One solvent selected from the above-described solvents or a mixture of two or more solvents selected from the above-described solvents may be used.

Preferably, the carboxylic acid may be selected from the group consisting of n-butyric acid, α-methylbutyric acid, i-valeric acid, 2-ethylbutyric acid, 2,2-dimethylbutyric acid, 3,3-dimethyl butyric acid, 2,3-dimethyl butyric acid, 3-methylpentanoic acid, 4-methylpentanoic acid, 2-ethylpentanoic acid, 3-ethylpentanoic acid, 2,2-dimethylpentanoic acid, 2-ethylhexanoic acid, and 3-ethylhexanoic acid.

Preferably, the ester used as the solvent may be selected from the group consisting of ethyl acetate, propyl acetate, n-butyl acetate, sec-butyl acetate, tert-butyl acetate, isobutyl acetate, n-amyl acetate, sec-amyl acetate, tert-amyl acetate, and isoamyl acetate. Preferably, alcohol used as the solvent may be selected from the group consisting of 1-propanl, 2-propanol, 1-butanol, 2-butanol, isobutyl alcohol, 1-pentanol, 2-pentanpl, 2-methyl-2-pentanol, and 2-methoxy ethanol.

Total concentration of the organic metal compound in the organic metal compound solution as a composition for forming a ferroelectric thin film is preferably controlled in the range of 0.1 to 20% by mass in converted amount where the amount of the organic metal compound is converted to the amount of metal oxide.

Where necessary, stabilizing agent may be added to the organic metal compound solution in an amount such that (number of molecules of the stabilizing agent)/(number of metal atoms) is 0.2 to 3. The stabilizing agent may be selected from the group consisting of β-diketones (for example, acetyl acetone, heptafluoro butanoyl pivaloyl methane, dipivaloyl methane, trifluoroacetylacetone, benzoylacetone or the like), β-ketonic acids (for example, acetoacetic acid, propionyl acetic acid, benzoyl acetic acid or the like), β-keto esters (for example, lower alkyl esters such as methyl, propyl, or butyl of the above-described ketonic acids), oxyacids (for example, lactic acid, glycol acid, α-oxybutyric acid, salicylic acid or the like), lower alkyl esters of the above-described oxyacids, oxyketones, diacetone alcohol, acetoin, or the like), diol, triol, higher carboxylic acid, alkanol amines (for example, diethanolamine, triethanolamine, monoethanolamine), and polyamine or the like.

Preferably, the compositions for forming a ferroelectric thin film includes β-diketone and polyhydric alcohol. More preferably, the composition includes acetyl acetone as the β-diketone and propylene glycol as the polyhydric alcohol.

Preferably, number of particles contained in the organic metal compound solution is controlled such that numbers of particles of 0.5 μm or more (more preferably, 0.3 μm or more, and more preferably, 0.2 μm or more) in diameter is 50 or less per 1 mL of the solution by removing the particles by filtering or the like. Where the number of particles of 0.5 μm or more in diameter in the organic metal compound solution exceeds 50/mL, the solution cannot be preserved stably for a long time. In the organic metal compound solution, it is preferable to reduce the number of particles of 0.5 μm or more in diameter to be as small as possible, preferably to 30/mL or less.

A treatment for controlling the number of particles to the above-described range is not particularly limited. For example, the following methods can be applied. In a first method, a commercially available membrane filter having a pore size of 0.2 μm is used for filtering, and the solution is sent to the filter under pressure by a syringe. A second method is a pressurized filtering using a commercially available membrane filter having a pore size of 0.2 μm and a pressurizing tank. A third method is a circulation filtering using the filter used in the second method and a solution circulating bath.

In any of the method, ratio of capturing the particles by the filter is different depending on the pressure for sending the solution. It is generally known that the ratio of capturing is increased as the pressure is decreased. Specifically in the first and the second method, it is preferable to filtrate the solution very slowly with low pressure so as to realize the conditions such that number of particles of 0.5 μm or more in diameter in the solution is 50/mL or less.

The composition for forming a ferroelectric thin film may be used in the formation of a ferroelectric layer as a constituent of a ferroelectric thin film. The ferroelectric layer may be obtained by coating the above-described composition on the base electrode oriented in the (111) direction by spin coating, dip coating, LSMCD (Liquid Source Misted Chemical Deposition) or the like, performing drying and preliminary firing of the coated composition using a hot plate or the like and thereby forming a gel layer, and performing firing of the gel layer using a hot plate or the like.

In the formation of the ferroelectric layer, the formation of the gel layer by coating, drying, and preliminary firing the composition may be repeated for a plurality of times, and the stacked gel layers may be fired in the same time. By this method, it is possible to form a ferroelectric thin film of desired thickness. In the first embodiment shown in FIG. 1, an orientation controlling layer (first ferroelectric layer) is formed directly on the surface of the base electrode 11 by the above-described method.

Drying and preliminary firing are performed so as to remove the solvent from the coated composition, and to convert the organic metal compound to composite oxide by thermal decomposition or by hydrolysis of the organic metal compound. Therefore, the heat treatment (calcination) for drying and preliminary firing is performed under the air atmosphere, oxidizing atmosphere, or water vapor containing atmosphere. Even in the air atmosphere, humidity in the air provides sufficient water component required for the hydrolysis. The heat treatment may be performed by two step heating including low-temperature hearting for removing the solvent and high-temperature heating for decomposing the organic metal compound.

Firing (main firing, second firing) is performed so as to heat a thin film obtained by the drying and preliminary firing at a temperature of not lower than crystallizing temperature, thereby crystallizing the thin film. By this treatment, a ferroelectric thin film is obtained. As an atmosphere for the crystallizing process, it is preferable to use an atmosphere of one gas selected from $O_2$, $N_2$, Ar, $N_2O$, and $H_2$ or the like or a mixed gas of two or more selected from those gases.

Drying and preliminary firing may be performed at a temperature of 150 to 550° C. for 1 to 10 minutes. Main firing is performed at a temperature of 450 to 800° C. for 1 to 60 minutes. The main firing may be performed by rapid thermal annealing (RTA treatment). When the main firing is performed by RTA treatment, it is preferable to control the temperature-increasing rate to 10 to 100° C./second.

Figure 2:
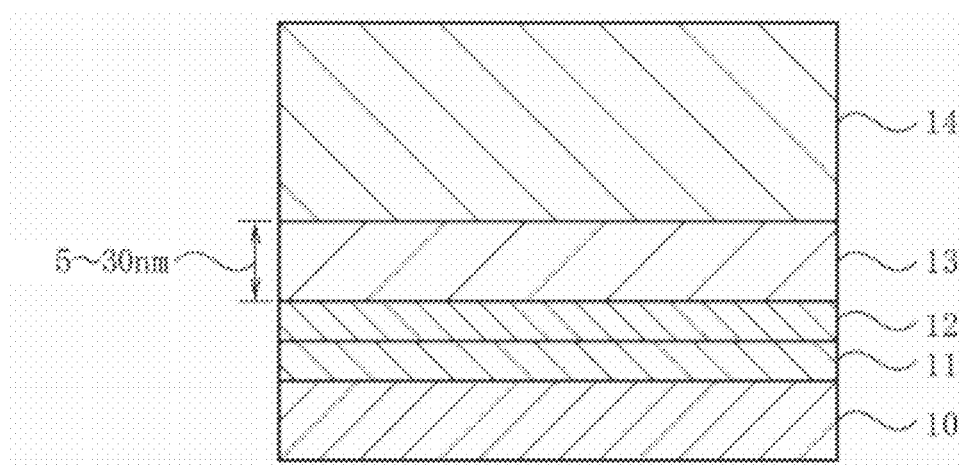
FIG. 2 is a schematic cross sectional drawing for explaining a production method according to a second aspect of the present invention.

FIG. 2 is a schematic cross sectional view showing a constitution of the second embodiment of the present invention. As shown in FIG. 2, it is preferable to form a crystal diameter controlling layer 12 on the base electrode 11 of the substrate 10 before forming the orientation controlling layer 13, and to form the orientation controlling layer 13 on the crystal diameter controlling layer 12. By the thus forming the crystal diameter controlling layer 12, it is possible to increase density of generated nuclei, thereby suppressing anomalous growth of crystals of the orientation controlling layer 13. As a result, it is possible to obtain the orientation controlling layer 13 having a preferred orientation in the (110) plane with fine crystal texture.

As a material of crystal diameter controlling layer 12, it is possible to use lead titanate, lead titanate zirconate, lead zirconate or the like. Preferably, thickness of the crystal diameter controlling layer is 1 nm to 10 nm. If the thickness of the crystal diameter controlling layer exceeds 10 nm, effect of enhancing generation density of nuclei cannot be obtained. As a result, it is impossible to achieve a fine crystal texture. Therefore, thickness of the crystal diameter controlling layer is controlled in the above-describe range.

As like as the formation of the above-described orientation controlling layer, the crystal diameter controlling layer 12 may be formed by coating a composition for crystal diameter controlling layer on the base electrode oriented in the (111) direction by spin coating, dip coating, LSMCD (Liquid Source Misted Chemical Deposition) or the like, performing drying and preliminary firing of the coated composition using a hot plate or the like at a temperature of 150 to 550° C. for 1 to 10 minutes. The process of coating, drying, and preliminary firing of the composition may be performed one time or may be repeated for a plurality of times so as to achieve a gel film (gel layer) of desired thickness. Where the crystal diameter controlling layer 12 is formed, the orientation controlling layer 13 is formed on the crystal diameter controlling layer 12. The gel film of the crystal diameter controlling layer 12 is crystallized in the time of main firing for forming the orientation controlling layer 12. Composition for the size may be prepared in the same manner as the above-explained preparation of the composition for forming a ferroelectric thin film, where concentration of the organic metal compound dissolved in the organic solvent is controlled depending on the designated thickness. For example, where a composition for forming a ferroelectric thin film has concentration of 2 to 12% or 5 to 12% by mass in conversion to the amount of metal oxide, the composition for the crystal diameter controlling layer may has a concentration of 1 to 2% by mass in conversion to the amount of metal oxide.

Both in the first embodiment and the second embodiment, it is preferable to form a thickness adjusting layer 14 on the orientation controlling layer 13 utilizing the orientation controlling layer 13 as a base layer such that the thickness adjusting layer 14 has the same crystal orientation as the base layer (orientation controlling layer 13). By forming the thickness adjusting layer 14 on the base layer, preferred orientation of crystal plane of the thickness adjusting layer 14 is formed similar to that of the orientation controlling layer 13 depending on the preferred orientation of the orientation controlling layer 13. By the thus forming a thickness adjusting layer 14, a thickness of ferroelectric thin film having a preferred orientation controlled to (110) plane by the presence of the orientation controlling layer can be adjusted arbitrarily depending on the intended use of the film.

The thickness adjusting layer 14 is a film made of the same Pb-containing perovskite type oxide as the orientation controlling layer 14. Preferably, thickness of the thickness adjusting layer 14 is smaller than 5000 nm. When a thickness of the thickness adjusting layer is 5000 nm or more, long processing time is required, and dependence of orientation of the thickness adjusting layer on the preferred orientation of the orientation controlling layer is deteriorated resulting in small degree of preferred orientation in the (110) plane.

Formation of the thickness adjusting layer 14 may be performed in the similar manner as the above-described formation of the orientation controlling layer 13. Composition for thickness adjusting layer is coated on the orientation controlling layer 13 by spin coating, dip coating, LSMCD (Liquid Source Misted Chemical Deposition) or the like. The coated composition is dried and preliminarily fired using a hot plate or the like at 150 to 550° C. for 1 to 10 minutes in the air atmosphere. After repeating the process from coating to drying and preliminary firing of the composition to form a gel film of designated thickness, the gel film is subjected to main firing in at 450 to 800° C. for 1 to 60 minutes in the oxygen atmosphere. The above-explained composition for forming a ferroelectric thin film can be used as the composition for the thickness adjusting layer as well as the composition for the orientation controlling layer. The orientation controlling layer 13 and the thickness adjusting layer 14 may be formed using the same composition for forming a ferroelectric thin film. Alternatively, the composition used in the formation of the orientation controlling layer 13 and the composition used in the formation of the thickness adjusting layer 14 may be selected from two compositions for forming ferroelectric thin films having different concentration of oxide component.

The thus produced ferroelectric thin film of the present invention is controlled to have preferred orientation in the (110) plane, and has large dielectric constant.

For example, where $I_{100}$, $I_{110}$, and $I_{111}$ respectively denote diffraction intensity of (100) plane, (110) plane, and (111) plane of ferroelectric crystals determined by X-ray diffraction of the ferroelectric thin film produced by the above-described method, degree of orientation defined by $I_{110}/(I_{100}+I_{110}+I_{111})$ is 0.77 or more where the ferroelectric thin film is composed of the orientation controlling layer and is 0.70 or more (for example, 0.70 to 0.91) where the ferroelectric thin film is composed of the orientation controlling layer and the thickness adjusting layer.

The ferroelectric thin film of the present invention may be used as a member of a composite electronic part of a device selected from a thin-film capacitor, a capacitor, an IPD, a condenser for a DRAM memory, a stacked capacitor, a gate insulator of a transistor, a non-volatile memory, a pyloelectric infrared sensor, a piezoelectric element, an electro-optic element, an actuator, a resonator, an ultrasonic motor, and a LC noise filer,

EXAMPLES

Next examples of the present invention and comparative examples are explained in detail.
Preparation of Composition for Crystal Diameter Controlling Layer, Composition for Orientation Controlling Layer, and Composition for Thickness Adjusting Layer As a typical process, the compositions were prepared by the following flows of solution synthesis.

Firstly, titanium tetra isopropoxide (Ti source), and acetyl acetone (stabilizing agent) were contained in a reaction vessel and were refluxed in nitrogen atmosphere at a temperature of 150° C. Next, the above-described chemical compound after the refluxing was added with lead acetate trihydrate (Pb source), and propylene glycol (solvent), and was refluxed in nitrogen atmosphere at 150° C. After removing byproducts from the thus formed solution by vacuum distillation, concentration of the solution was controlled by adding diluted alcohol, thereby obtaining a composition for crystal diameter controlling layer. By the above-described method, ratio of metals in the ratio in converted oxide was controlled to be Pb/Ti=125/100. As shown in Table 1, two types of compositions for respectively containing metal compound of 1% by mass and 2% by mass in concentration of converted lead titanate (PT) component were prepared.

Firstly, zirconium tetra-n-butoxide (Zr source) and acetyl acetone were contained in a reaction vessel and were refluxed in nitrogen atmosphere at 150° C. Next, the above-described chemical compound was added with titanium tetra-isopropoxide and acetyl acetone as a stabilyzing agent, and was refluxed in nitrogen atmosphere at a temperature of 150° C. Next, the compound was added with lead acetate trihydrate, and propylene glycol as a solvent and was refluxed in nitrogen atmosphere at a temperature of 150° C. After removing byproducts from the thus formed solution by vacuum distillation at 150° C., diluted alcohol was added to the solution thereby controlling the concentration of metallic compound in the solution, thereby obtaining a composition for forming a ferroelectric thin film. By the above-described method, ratio of metals in the ratio in converted oxide was controlled to be Pb/Zr/Ti=110/52/48.

As shown in Table 1, five types of compositions for respectively containing metal compound of 2% by mass, 5% by mass, 7% by mass, 10% by mass, and 12% by mass in concentration of converted PZT component were prepared and were used as the composition for the orientation controlling layer and the composition for the thickness adjusting layer.

The above-described organic metal compound solution constituting the composition for crystal diameter controlling layer, composition for orientation controlling layer, and composition for thickness adjusting layer were filtrated by sending each solution under pressure by a syringe to a commercial membrane filter having pore diameter of 0.2 μm. As a result, number of particles of 0.5 μm or more in diameter was 1/mL, 2/mL, and 1/mL respectively.

Formation of Ferroelectric Thin Film

Eleven substrates having a Si substrate body and a Pt base electrode were prepared. Each substrate was prepared by forming the Pt base electrode by sputtering method on a Si substrate of 6 inches in diameter. Ferroelectric thin films of Examples 1 to 8 and Comparative Examples 1 to 3 were respectively formed on the Pt base electrode of the substrate using the compositions formed by the above-explained preparation process under different film formation conditions. Film formation conditions of ferroelectric thin films of Examples 1 to 8 and Comparative Examples 1 to 3 are shown in Table 1. Coating of the composition was performed using a spin coater. In Table 1, "repetition" shows a number of repeated coating and calcination the composition, rotation rate and time respectively show rotation rate of the spin coater and time of rotation at that rate. In each of the coating conditions, the spin coater was rotated at a rate of 500 rpm for 3 seconds in the starting of coating, and subsequently rotated at a rate shown in Table 1. Calcination (drying and preliminary firing) was performed using a hot plane in the air atmosphere. In each case, formation process of the orientation controlling layer and formation process of the thickness adjusting layer each included main firing performed one time after performing coating and calcination of the composition for one time or plurality times. The main firing was performed by heating the substrate to 700° C. at heating rate of 10° C./second and annealing the substrate at 700° C. for 1 minute in oxygen atmosphere, thereby crystallizing the film after the calcination. Examples of detailed formation processes of the orientation controlling layer, thickness adjusting layer, and the crystal diameter controlling layer are described in the below described explanation of Examples 1, 2, and 7.

TABLE 1

|  |  | Examples |  |  |  |  |  |  |  | Comparative Examples |  |  |
|---|---|---|---|---|---|---|---|---|---|---|---|---|
|  |  | 1 | 2 | 3 | 4 | 5 | 6 | 7 | 8 | 1 | 2 | 3 |
|  |  |  |  |  |  |  | Number |  |  |  |  |  |
| Crystal diameter controlling layer | Concentration (mass %) |  |  |  |  |  |  | 1 | 2 |  |  |  |
|  | Frequency of coating |  |  |  |  |  |  | 1 | 1 |  |  |  |
|  | Rotation rate (rpm) |  |  |  |  |  |  | 2000 | 2000 |  |  |  |
|  | Time (second) |  |  |  |  |  |  | 20 | 20 |  |  |  |
|  | Calcination temperature (° C.) |  |  |  |  |  |  | 200 | 200 |  |  |  |
|  | Time of calcination |  |  |  |  |  |  | 5 | 5 |  |  |  |
| Controlled orientation layer | Concentration (mass %) | 5 | 5 | 5 | 5 | 2 | 7 | 5 | 7 | 10 | 12 | 10 |
|  | Frequency of coating | 1 | 1 | 1 | 1 | 1 | 1 | 1 | 1 | 1 | 1 | 6 |
|  | Rotation rate (rpm) | 2000 | 2000 | 2000 | 2000 | 2000 | 2000 | 2000 | 2000 | 2000 | 2000 | 3000 |
|  | Time of rotation (second) | 20 | 20 | 20 | 20 | 20 | 20 | 20 | 20 | 20 | 20 | 20 |
|  | Calcination temperature (° C.) | 180 | 200 | 250 | 300 | 200 | 200 | 200 | 200 | 200 | 200 | 200 |
|  | Time of calcination (minute) | 5 | 5 | 5 | 5 | 5 | 5 | 5 | 5 | 5 | 5 | 5 |
|  | Frequency of firing | 1 | 1 | 1 | 1 | 1 | 1 | 1 | 1 | 1 | 1 | 1 |

TABLE 1-continued

| | | Examples | | | | | | | | Comparative Examples | | |
|---|---|---|---|---|---|---|---|---|---|---|---|---|
| | | 1 | 2 | 3 | 4 | 5 | 6 | 7 | 8 | 1 | 2 | 3 |
| | | | | | | | Number | | | | | |
| Thickness adjusting layer | Concentration (mass %) | | 12 | 12 | 12 | 12 | 12 | 12 | 12 | (12) | 12 | |
| | Frequency of coating | | 4 | 4 | 4 | 4 | 4 | 4 | 4 | (4) | 4 | |
| | Rotation rate (rpm) | | 2000 | 2000 | 2000 | 2000 | 2000 | 2000 | 2000 | (2000) | 2000 | |
| | Time of rotation (second) | | 20 | 20 | 20 | 20 | 20 | 20 | 20 | (20) | 20 | |
| | Calcination temperature (° C.) | | 300 | 300 | 300 | 350 | 450 | 300 | 300 | (300) | 300 | |
| | Time of calcination (minute) | | 5 | 5 | 5 | 5 | 5 | 5 | 5 | (5) | 5 | |
| | Frequency of firing | | 1 | 1 | 1 | 1 | 1 | 1 | 1 | 1 | 1 | |

Example 1

A substrate having a Pt base electrode was prepared by forming the Pt base layer on a silicon substrate by sputtering method. Composition for orientation controlling layer of 5% by mass in concentration which had been prepared as described-above was coated on the Pt base electrode by spin coating method, where the spin coating was performed firstly with a rotation rate of 500 rpm for 3 seconds, and subsequently with a rotation rate of 2000 rpm for 20 seconds. Next, the coated composition was dried and preliminarily fired by heating the substrate using a hot-plate at 180° C. for 5 minutes in the air atmosphere. After performing the coating and calcination of the composition for one time, the coated composition was subjected to firing (main firing) by heating the substrate to 700° C. with heating rate of 10° C./second and annealing the substrate at 700° C. for 1 minute in oxygen atmosphere. By this process, the coated composition was crystallized, and an orientation controlling layer of 20 nm in thickness was obtained. Ferroelectric thin film of Example 1 was constituted of the orientation controlling layer.

Examples 2

An orientation controlling layer of 20 nm in thickness was formed on Pt base electrode of the substrate in a similar manner as in Example 1 except for the calcination temperature for drying and preliminary firing of the composition, where the calcination temperature was 200° C. After that, composition for a thickness adjusting layer was coated on the orientation controlling layer by spin coating method. The composition which was prepared as described above had a concentration of 12% by mass. The spin coating was performed firstly at a rotation rate of 500 rpm for 3 seconds, and subsequently at a rotation rate of 2000 rpm for 20 seconds. Next, using a hot plate, the coated composition was dried and preliminary fired at a temperature of 300° C. for five minutes. The above-described step of coating and subsequent calcination of the composition for thickness adjusting layer was repeated for 4 times. After that, the coated composition was crystallized by main firing in oxygen atmosphere. In the main firing, the coated composition was subjected to firing by heating the substrate to 700° C. with heating rate of 10° C./second and annealing the substrate at 700° C. for 1 minute in oxygen atmosphere. Thus, a thickness adjusting layer of 300 nm in thickness. The thus produced orientation controlling layer and the thickness adjusting layer constitute a ferroelectric thin film of Example 2.

Examples 3, 4, 5, 6

In each of Examples 3, 4, 5, and 6, orientation controlling layer was formed on the Pt base electrode of a substrate, and thickness adjusting layer was formed on the orientation controlling layer using film formation conditions shown in Table 1. Thickness of each layer is shown in Table 2.

Example 7

In Example 12, composition for crystal diameter controlling layer which had been prepared as described-above to have a concentration of 1% by mass was coated on the Pt base electrode of the substrate by spin coating method, where the spin coating was performed firstly with a rotation rate of 500 rpm for 3 seconds, and subsequently with a rotation rate of 2000 rpm for 20 seconds. Next, the coated composition was dried and preliminarily fired by heating the substrate using a hot-plate at 200° C. for 5 minutes in the air atmosphere, thereby obtaining a crystal diameter controlling layer of 2 nm in thickness. Next, an orientation controlling layer was formed on the crystal diameter controlling layer, and a thickness adjusting layer was formed on the orientation controlling layer, using film formation conditions shown in Table 1, thereby constituting a ferroelectric thin film of Example 7. In Example 8, a ferroelectric thin film was formed in similar manner as Example 7 except for the concentration of orientation controlling layer, where the concentration for the orientation controlling later was 7% by mass.

Comparative Examples 1, 2, 3

In Comparative Example 1, a ferroelectric thin film constituted of an orientation controlling layer of 35 nm in thickness and a thickness adjusting layer of 300 nm in thickness was formed in similar manner as Example 4 except for the concentration of the orientation controlling layer, where the concentration was 10% by mass.

In Comparative Example 2, a ferroelectric thin film constituted of an orientation controlling layer of 75 nm in thickness and a thickness adjusting layer of 300 nm in thickness was formed in similar manner as Example 4 except for the concentration of the orientation controlling layer, where the concentration was 12% by mass.

Figure 3:
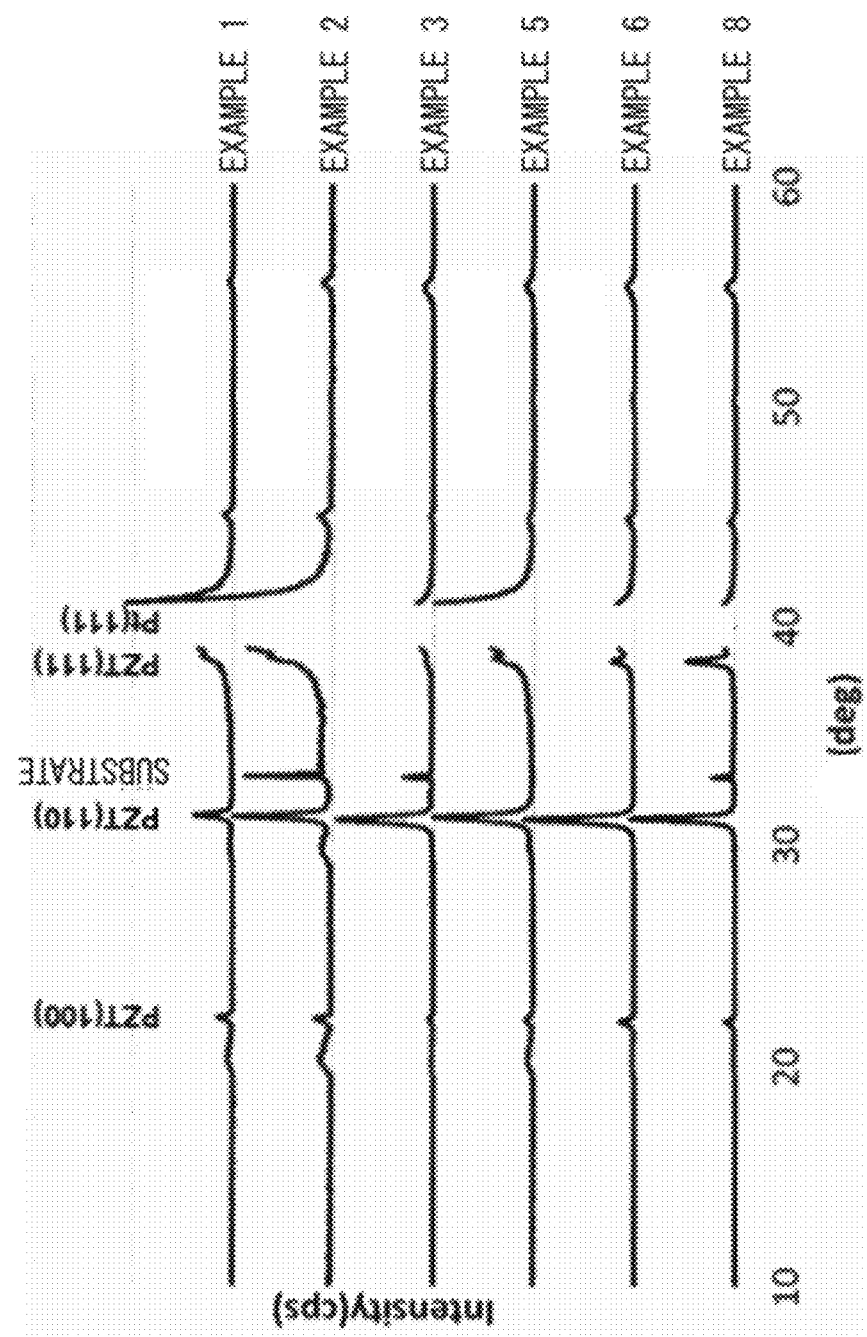
FIG. 3 shows XRD patterns of Examples 1, 2, 3, 5, 6 and 8.
Figure 4:
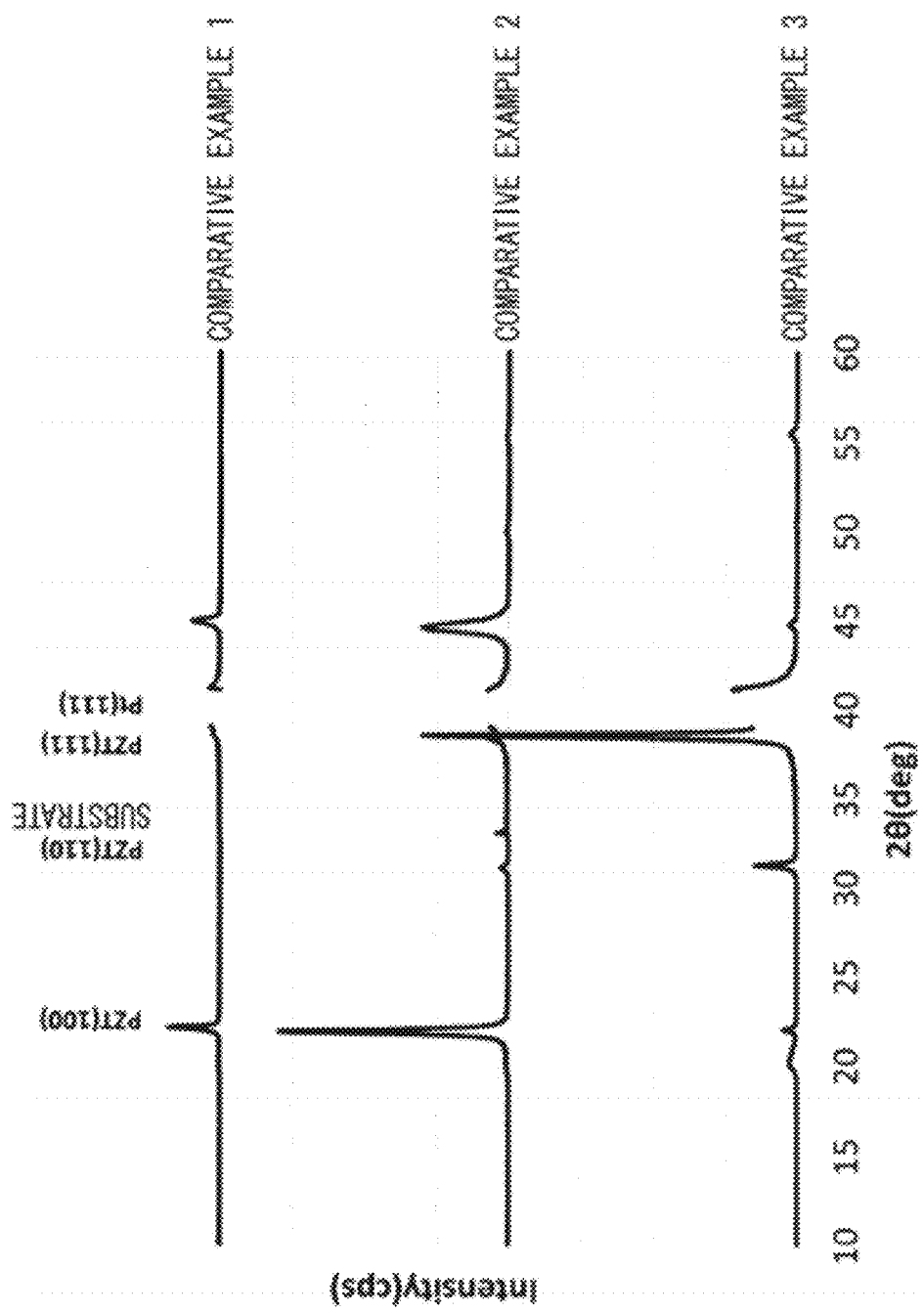
FIG. 4 shows XRD patterns of Comparative Examples 1, 2, and 3.

In Comparative Example 7, a ferroelectric thin film was constituted of an orientation controlling layer of 270 nm in thickness which was formed on the Pt base electrode of a substrate by repeating a step of coating, drying and preliminary firing of a composition for an orientation controlling layer for 6 times and subsequently performing firing of the composition. The film formation conditions are shown in Table 1.
Comparing Experiment Thickness of each layer, crystal plane of preferred orientation, degree of the preferred orientation, and average grain diameter of each of ferroelectric thin films obtained in Examples 1 to 8 and Comparative Examples 1 to 3 were determined as shown in Table 2 in accordance with the below described method. XRD patterns of Examples 1, 2, 3, 5, 6, and 8 are shown in FIG. 3. XRD patterns of Comparative Examples 1 to 3 are shown in FIG. 4. A surface SEM image (10000 times magnification) of a ferroelectric thin film of Example 2 is shown FIG. 5. A surface SEM image (5000 times magnification) of a ferroelectric thin film of Example 7 is shown FIG. 6.

1. Measurement of Layer (Film) Thickness

Thickness of each layer was determined by the following procedure. Firstly, each ferroelectric thin film was measured using a spectroscopic ellipsometer (J.A. Woollam Corporation: M-2000), thereby determining a total thickness of a crystal diameter controlling layer and an orientation controlling layer, a thickness of the orientation controlling layer, and a thickness of a thickness adjusting layer. Thickness of the crystal diameter controlling layer was determined by subtracting a thickness of the orientation controlling layer from the total thickness of the crystal diameter controlling layer and the orientation controlling layer.

2. Plane of Preferred Orientation

Preferentially oriented crystal plane was determined by measurement of each ferroelectric thin film using a X-ray diffraction apparatus (XRD: Bruker Corporation: MXP18HF). A plane of highest diffraction intensity selected from the planes of ferroelectric crystal detected in the XRD chart was regarded as a plane of preferred orientation (preferentially oriented crystal plane).

3. Degree of Orientation

Degree of (110) preferred orientation was determined using diffraction intensities obtained in the above-described measurement, and was defined to be $I_{110}/(I_{100}+I_{110})$ where $I_{100}$ was the diffraction intensity of (100) plane and $I_{110}$ was the diffraction intensity of (110) plane of ferroelectric crystals.

4. Average Grain Diameter

SEM image of a surface of each ferroelectric thin film was obtained by scanning electron microscope (SEM; HITACHI Corporation: S-900). 30 crystal grains were arbitrarily selected from the SEM photograph (surface image) and diameter (longest diameter and shortest diameter) of each crystal was measured using a vernier caliper. The average diameter of the crystals was calculated from the results of the measurements.

ing layer formed on an orientation controlling layer respectively showed preferred orientation in the (110) plane, it was confirmed that the same preferred orientation of the orientation controlling layer was maintained in crystal plane orientation of the thickness adjusting layer, and that the thickness of a ferroelectric thin film preferentially oriented in the (110) plane could be controlled arbitrarily by the presence of the thickness adjusting layer.

On the other hand, each of Comparative Example 1 having an orientation controlling layer of 35 nm in thickness and Comparative Example 2 having an orientation controlling layer of 75 nm in thickness showed preferred orientation in the (100) plane. Comparative Example 3 having an orientation controlling layer of 270 nm in thickness showed preferred orientation in the (111) plane.

Figure 5:
FIG. 5 shows a surface SEM image (10000 times magnification) of Example 2.
Figure 6:
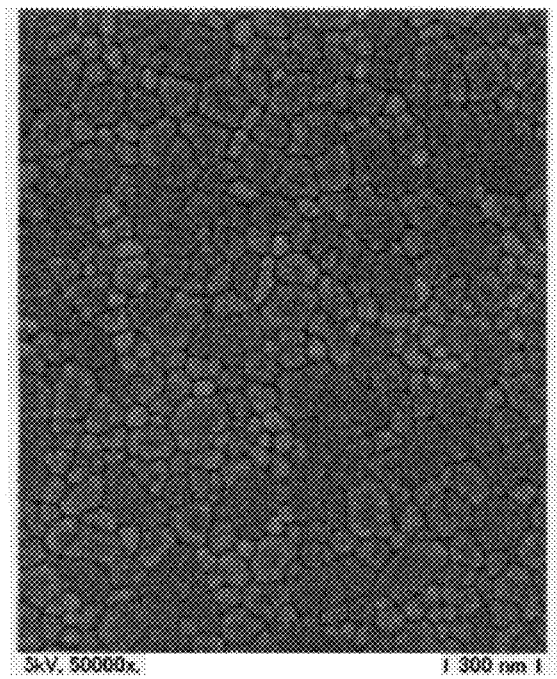
FIG. 6 shows a surface SEM image (50000 times magnification) of Example 7.

As it is obvious from FIG. 5 and FIG. 6, compared to ferroelectric thin films of Examples 1 to 6 formed without introducing crystal diameter controlling layer, ferroelectric thin films of Examples 7 and 8 formed on the crystal diameter controlling layer had crystal texture of fine grain diameter in the outermost layers of the films.

According to the production method of the present invention, it is possible to achieve a ferroelectric thin film having preferred crystal orientation in the (110) plane can be obtained with a simple process without using a seed layer or a buffer layer. In addition, the obtained Pb-containing perovskite type ferroelectric thin film such as PZT film having (110)-preferred orientation has large dielectric constant, and is applicable in film capacitors, capacitors or the like.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method for producing a ferroelectric thin film comprising:
    forming a ferroelectric thin film on a base electrode of a substrate having a substrate body and the base electrode that has crystal faces oriented in the (111) direction,

TABLE 2

|  | Thickness of crystal diameter controlling layer [nm] | Thickness of orientation controlling layer [nm] | Thickness of thickness adjusting layer [nm] | Preferentially oriented plane | Degree of preferred orientation in (110) plane | Average grain diameter [μm] |
| --- | --- | --- | --- | --- | --- | --- |
| Example 1 | 0 | 20 | 0 | (110) | 0.77 | 2.31 |
| Example 2 | 0 | 20 | 300 | (110) | 0.88 | 2.38 |
| Example 3 | 0 | 20 | 300 | (110) | 0.85 | 2.22 |
| Example 4 | 0 | 20 | 300 | (110) | 0.91 | 2.09 |
| Example 5 | 0 | 5 | 300 | (110) | 0.78 | 2.43 |
| Example 6 | 0 | 30 | 300 | (110) | 0.80 | 2.24 |
| Example 7 | 2 | 20 | 300 | (110) | 0.70 | 0.11 |
| Example 8 | 5 | 30 | 300 | (110) | 0.78 | 0.13 |
| Comparative 1 | 0 | 35 | 300 | (100) | 0 | 1.88 |
| Comparative 2 | 0 | 75 | 300 | (100) | 0.03 | 1.13 |
| Comparative 3 | 0 | 270 | 0 | (111) | 0.10 | 0.12 |

As it is obvious from Table 2, FIG. 3, and FIG. 4, ferroelectric thin films having high degree of preferential orientation in the (110) plane in the range of 0.70 to 0.91 were obtained in Examples 1 to 8 in which thickness of the orientation controlling layer was controlled in the range of 5 nm to 30 nm. Since Examples 2 to 8 each having a thickness adjustwherein the formation of the ferroelectric thin film includes performing formation of an orientation controlling layer by a process including coating a composition for forming the ferroelectric thin film on the base electrode, performing calcination of the coated composition, and subsequently performing firing of the coated composition to crystallize the coated composition, where an amount of the composition for forming the ferroelectric thin film coated on the base electrode is controlled such that a thickness of the orientation controlling layer after crystallization is in a range of 5 nm to 30 nm, and thereby controlling the preferred orientation of crystals of the orientation controlling layer in the (110) plane, and wherein the method further comprises forming a crystal diameter controlling layer on the base electrode before forming the orientation controlling layer, wherein the orientation controlling layer is formed on the crystal diameter controlling layer and the crystal diameter of the orientation controlling layer is equal to the crystal diameter of the crystal diameter controlling layer as a result.

2. The method for producing a ferroelectric thin film according to claim 1, wherein the calcination for forming the orientation controlling layer is performed at a temperature in a range of 180° C. to 300° C.

3. The method for producing a ferroelectric thin film according to claim 1, wherein the formation of the ferroelectric thin film further comprises, after forming the orientation controlling layer, forming a thickness adjusting layer having a preferential crystal orientation that is the same as the preferential crystal orientation of the orientation controlling layer by coating the composition for forming the ferroelectric thin film on the orientation controlling layer, performing calcination of the composition coated on the orientation controlling layer, and performing firing of the composition coated on the orientation controlling layer to achieve the crystallization thereof.

4. The method for producing a ferroelectric thin film according to claim 3, wherein the calcination for forming the thickness adjusting layer is performed at a temperature in a range of 300° C. to 450° C.

5. The method for producing a ferroelectric thin film according to claim 3, wherein the formation of the thickness adjusting layer further includes sequentially repeating, for at least one time, the steps of coating the composition for forming the ferroelectric thin film and of performing calcination of the coated composition, wherein the step of performing firing of the coated composition occurs after the sequential repetition of coating and calcination.

6. The method for producing a ferroelectric thin film according to claim 1, wherein the ferroelectric thin film includes Pb-containing perovskite type oxide, and the composition for forming the ferroelectric thin film includes β-diketone and polyhydric alcohol.

7. The method for producing a ferroelectric thin film according to claim 6, wherein the β-diketone is acetylacetone and the polyhydric alcohol is propylene glycol.

8. The method for producing a ferroelectric film according to claim 1, wherein the substrate body is one selected from a silicon substrate and a sapphire substrate.

9. The method for producing a ferroelectric thin film according to claim 1, wherein the base electrode is made of at least one metal selected from the group consisting of Pt, Ir, and Ru.

10. The method for producing a ferroelectric thin film according to claim 1, wherein the crystal diameter controlling layer is made of at least one compound selected from the group consisting of lead titanate, lead zircontate titanate, and lead zirconate.

* * * * *